US012748907B1

(12) United States Patent
Shusterman et al.

(10) Patent No.: US 12,748,907 B1
(45) Date of Patent: Sep. 29, 2026

(54) REDUCING COMPONENT DATABASE SIZE FOR REDUCED RUN-SET EVALUATION

(71) Applicant: Amazon Technologies, Inc., Reno, NV (US)

(72) Inventors: Ilan Shusterman, Tel Aviv-Jaffa (IL); Yuri Geogdjaev, Netanya (IL)

(73) Assignee: Amazon Technologies, Inc., Reno, NV (US)

( * ) Notice: Subject to any disclaimer, the term of this patent is extended or adjusted under 35 U.S.C. 154(b) by 854 days.

(21) Appl. No.: 18/083,115

(22) Filed: Dec. 16, 2022

(51) Int. Cl.
*G06F 30/398* (2020.01)
*G06F 30/392* (2020.01)

(52) U.S. Cl.
CPC .......... *G06F 30/398* (2020.01); *G06F 30/392* (2020.01)

(58) Field of Classification Search
CPC .............................. G06F 30/398; G06F 30/392
USPC .......................................................... 716/100
See application file for complete search history.

(56) References Cited

U.S. PATENT DOCUMENTS 10,223,491 B2 * 3/2019 Barowski .............. G06F 30/394
10,685,166 B1 * 6/2020 Kao ...................... G06F 30/398
10,713,411 B1 * 7/2020 Chang ........................ G03F 1/36
2005/0172252 A1 * 8/2005 Cheng ................... G06F 30/392 716/139
2008/0231629 A1 * 9/2008 Pai .......................... G06F 30/39 345/419
2009/0210836 A1 * 8/2009 Phan Vogel .......... G06F 30/398 716/107
2012/0254818 A1 * 10/2012 Liu ....................... G06F 30/337 716/135
2017/0154147 A1 * 6/2017 Jayaraman ............ G06F 30/392
2022/0365443 A1 * 11/2022 Kang .................. G03F 7/70291

* cited by examiner

*Primary Examiner* — Suchin Parihar
(74) *Attorney, Agent, or Firm* — Hogan Lovells Cadwalader US LLP

(57) ABSTRACT

Systems and methods parse integrated circuit (IC) design files to identify boundary conditions between components. The boundary conditions may correspond to connections between different components, at various levels of the IC, that may create antennas during one or more manufacturing processes. The identified boundary conditions may be extracted from the design files to generate lighter weight design files that eliminate parameters that are not associated with the boundary conditions. Design files for each component within a system may be parsed and checked for boundary conditions prior to delivery and integration to a top level design file. Thereafter, the top level may be executed with a run-set, such as to perform an antenna check.

20 Claims, 8 Drawing Sheets

REDUCING COMPONENT DATABASE SIZE FOR REDUCED RUN-SET EVALUATION

BACKGROUND

Electronic design automation (EDA) tools may be used in the design and manufacturing process of various electronic components, such as integrated circuits (ICs) or a system on chip (SoC). The EDA tools may provide logical and/or physical representations of various components to facilitate in design and manufacturing. For example, a design file from the EDA tools may be used with various checks to analyze different aspects and properties of the components prior to manufacturing. However, while the EDA tools may enable improved design, various systems still include collections of components, which may be designed by different personnel, that need to be integrated into a single unit for manufacturing. As a result, there may be complex relationships and connections between various components. Individually checking this collection of components prior to manufacturing is a time and resource-intensive process. Not only does it take considerable time and resources to check systems prior to manufacturing, but identifications of errors may lead to costly redesigns, which then need to be rechecked using the same time and resource-intensive processes.

BRIEF DESCRIPTION OF THE DRAWINGS

Various embodiments in accordance with the present disclosure will be described with reference to the drawings, in which.

DETAILED DESCRIPTION

Figure 1:
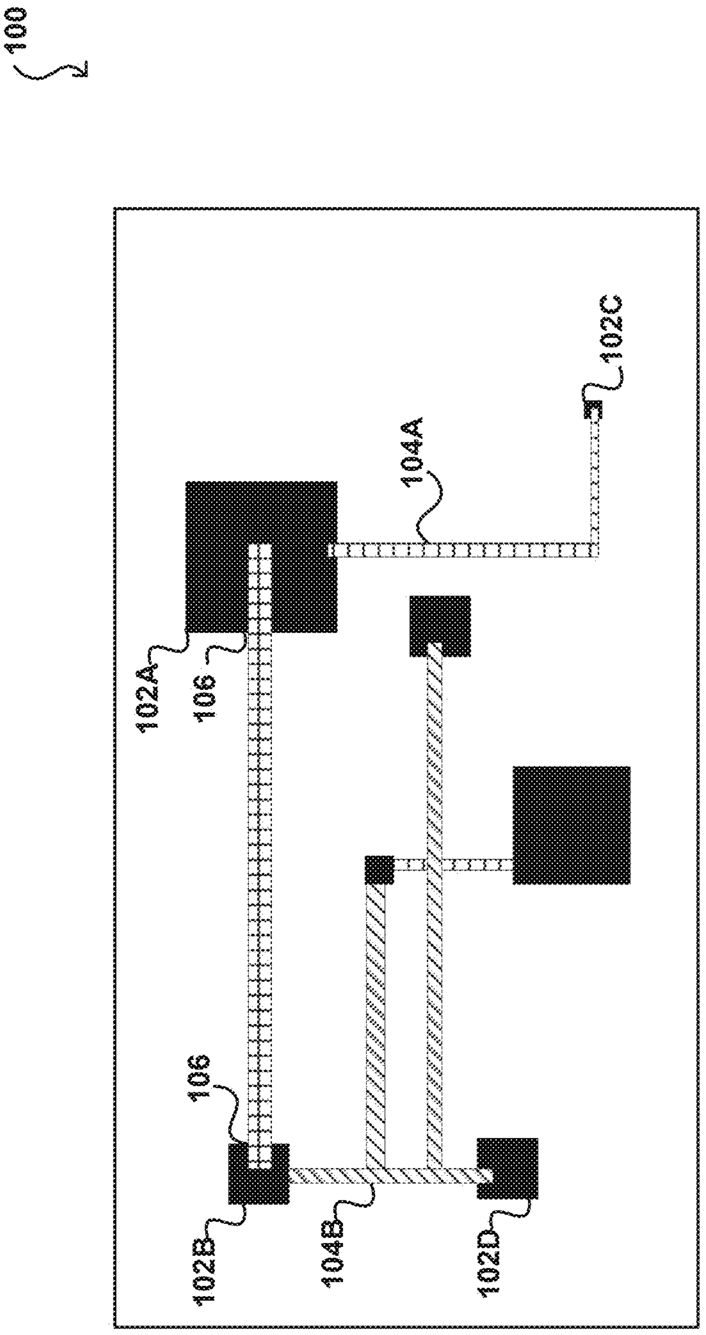
FIG. 1 illustrates an example layout of an integrated circuit that can be utilized in accordance with various embodiments.

Approaches in accordance with various embodiments can be used to evaluate a computing device or component, such as a design for an integrated circuit (IC) (e.g., a microprocessor, or a system on chip (SoC)). In particular, various embodiments can be used with different run-sets prior to manufacturing and production of different ICs and SoCs to create smaller, lighter design files that can be evaluated and checked faster than a full design file. Furthermore, fewer resources are consumed to perform the evaluation. Moreover, in the event errors are discovered, solutions can be tested faster by rechecking modifications on similarly lighter design files. In at least one embodiment, boundaries between components, corresponding to connections between different components, are identified within design files and extracted, thereby removing non-boundary information from the file. The extracted boundary information may be used to make a lighter weight design file. The lighter weight design file may correspond to a file that occupies less memory and/or to a file that has a reduced number of sub-components within an associated database. The lighter file may then be integrated into a top level file for evaluation against a run-set, for example to perform an antenna check. Embodiment could further be used in additional applications where light databases may permit faster evaluation, including but not limited to, internal run sets, routing topology evaluation, fast flight extraction for static timing analysis purposes, and the like. By only performing checks at the boundary conditions, the run-set and/or other applications may be executed faster when compared to execution against the entire design file.

Various embodiments provide for systems and methods to parse design files to identify boundary conditions between components. These identified boundary conditions may then be extracted from the design files to generate lighter weight design files, which may also be referred to as reduced design files or skins. The reduced design files may be associated with a smartly reduced database for one or more processing checks associated with the run-set. The reduced design files may include a smaller quantity of data content than original design files. In certain embodiments, the reduced design files are smaller in terms of a quantity of memory when compared to their original design files. In at least one embodiment, each individual component within a system may be parsed and checked for boundary conditions prior to delivery and integration to a top level of a hierarchical structure. Thereafter, the top level may be executed with a run-set, such as to perform an antenna check or one or more additional top level evaluations, prior to delivery of the full design file to a foundry for fabrication and production.

In at least one embodiment, an Open Artwork System Interchange Standard (OASIS) file may represent and express an electric pattern for an IC design. The OASIS file may be developed from, or converted to, a Design Exchange Format (DEF) file that provides a logical and physical representation of the IC topography in an ASCII format. One or both of these files for an IC design may be parsed to identify and extract boundary conditions. In at least one embodiment, the OASIS or DEF file is for a singular component within an overall IC design. The extracted boundary conditions may then optionally be converted into a specific format in order to execute a run-set against a reduced-file that eliminates certain features not associated with the boundary conditions. In this manner, the run-set may be performed faster when compared to execution against a full design file.

In the description herein, various embodiments are described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described. Various other functions can be implemented within the various embodiments as well as discussed and suggested elsewhere herein.

FIG. 1 illustrates an example cell view 100 associated with an IC design. The cell view 100 may also be referred to as an IC layout, IC mask layout, or mask design and may generally provide a representation of an IC. For example, various shapes may be used to represent components and connections between different components, where these components and connections may extend through different layers of the IC as they are built up through various processing steps, such as different deposition, growth, etching, polishing, and other steps. In this example, the cell view 100 illustrates various components 102 that are arranged at different locations on a substrate and include connections 104 extending between the components 102. The connections may represent wires or channels that include conductive material to allow electrical communication between different components. It should be appreciated that the components 102 may include different devices that may be used for one or more functions, such as a multiplier, a cache, and various others.

In this example, different components 102 are coupled together via different connections 104, as illustrated by the different patterns representative of the connections 104. It should be appreciated that these connections may be overlaid on top of one another and may not otherwise be in contact. By way of example only, the component 102A is connected to both the component 102B and the component 102C using the connection 104A. The component 102B, however, is connected to the component 102D via the connection 104B. Similar connections are shown for the other components 102 in the system, where different boundaries 106 may be represented by edges or other locations where an electrical connection is formed. As shown, each of the components 102 may include one or more boundaries 106 associated with an electrical connection.

The cell view 100 may represent a hierarchical illustration of the IC design, in which different connections 104 and/or components 102 may be built up or placed at different levels. For example, while the embodiment shows connections that are horizontal, it should be appreciated that there may also be connections from a top (e.g., looking down onto the plane of the page) or from the bottom. During the design process, each level may be built up and eventually provided for top level integration. The top level integration may provide a representation of the IC design in either the OASIS and/or DEF formats, in which the topology for the IC is laid out.

Prior to manufacturing and production, a foundry may provide a set of rules or requirements known as a run-set. The run-set may be in the form of an executable file that is processed or evaluated against the final design (e.g., against the OASIS or DEF of the top level IC layout). During evaluation, various conditions may be checked, with one specific example being an antenna check. An antenna may refer to a metal interconnect that is not grounded during one or more processing steps. During the manufacturing process, different operations (e.g., polishing, etching, etc.) may cause a charge to accumulate within the antenna. The charge may exceed a threshold and then discharge, which may damage one or more components of the IC, such as a transistor. The run-set may evaluate the design to identify these antennas and, if possible, either remove the antennas or otherwise ensure they are small enough such that the charge will not accumulate to the point of discharge and damage to components. Because the final design file may include each component and interconnection for the IC, it may take a long time to execute the run-set. This is undesirable because each iterative change will also require the long run time to rerun the run-set. Embodiments of the present disclosure address this problem by generating a smaller file for evaluation that only includes connections between components. As a result, the boundary conditions (which can be identified in the OASIS or DEF files) are evaluated for connections and a new file is generated that only includes those boundary locations, while removing other information. In this manner, the run-set takes less time to run while still identifying potential antenna issues.

Figure 2A:
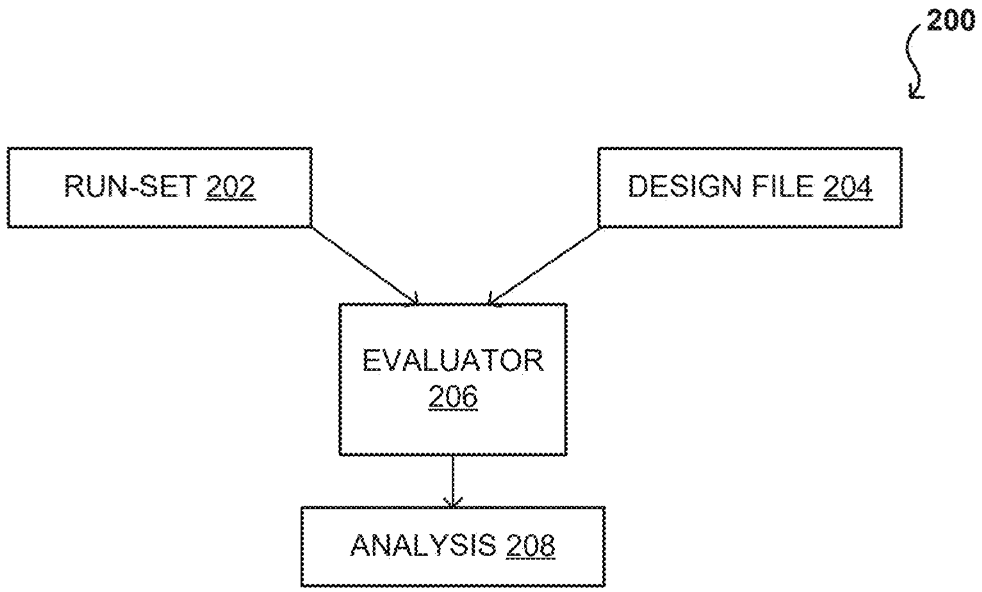
FIGS. 2A and 2B illustrate example design file evaluators that can be utilized in accordance with various embodiments.

FIG. 2A illustrates an evaluation process 200 for an IC design in accordance with various embodiments. In this example, a run-set 202 is provided that includes various rules or parameters associated with a foundry for production of an IC. The run-set 202 may be an executable file that is evaluated in view of a design file 204. The design file 204 may be an OASIS file or a DEF file, as both formats provide configuration information regarding layouts for an IC. An evaluator 206, such as one or more servers that execute software instructions, may be used to execute the run-set 202 against the design file 204 to determine whether one or more rules or parameters are violated. In an example associated with an antenna check, the run-set 202 may be used to determine whether a charge will build up during the manufacturing of the IC associated with the design file 204 such that a discharge could damage one or more components. An output analysis 208 may provide information to the owner of the design file 204 identifying problematic locations for reconfiguration and evaluation. This process may be time consuming, as the evaluator 206 may take several hours to process the entire design file 204 in order to produce the output analysis 208. Thereafter, modifications to the design file 204 will further undergo the multi-hour evaluation, and if there are additional errors, further redesign and processing may be required. Embodiments address this problem by generating, from the design file 204, a lighter weight file, which may be referred to as a skin or skin design file, in order to enable faster evaluation for critical areas, such as at boundary conditions.

Figure 2B:
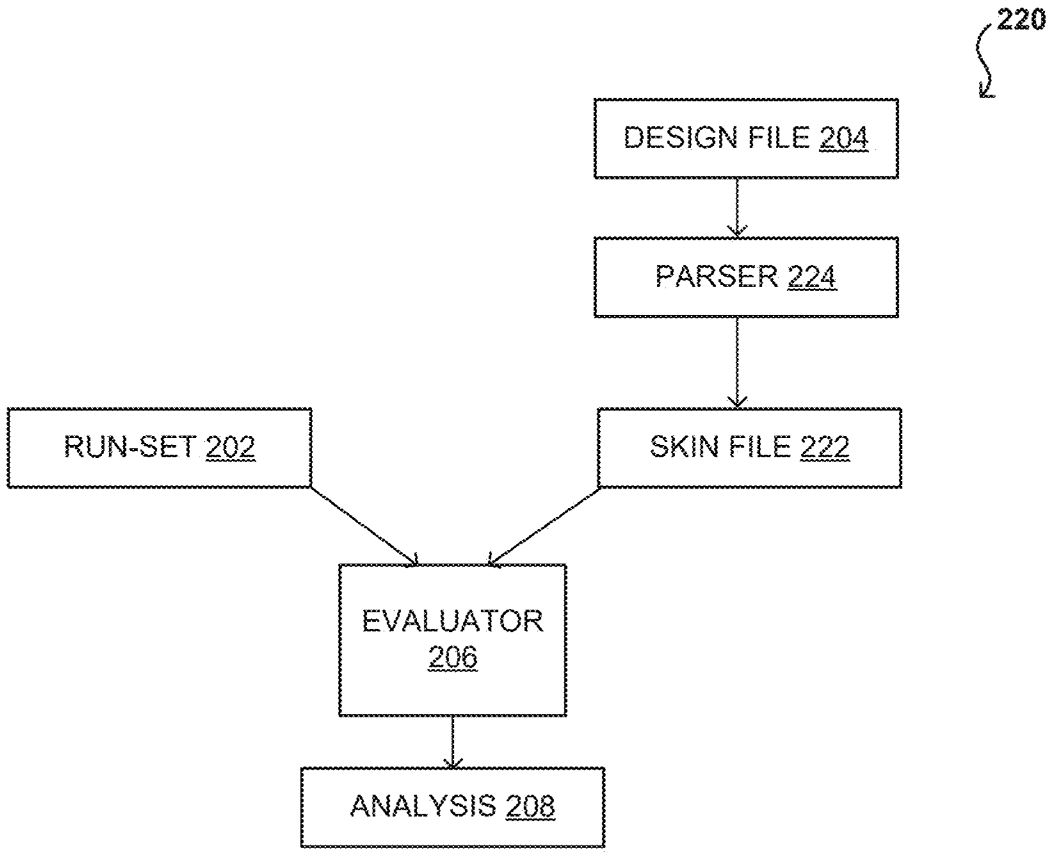

FIG. 2B illustrates an evaluation process 220 in which the run-set 202 is evaluated against a skin 222 that is parsed from the design file 204. For example, the initial design file 204 may be evaluated, using a parser 224, to identify boundary conditions within the design file 204 associated with connections between components. These boundary conditions may then be identified and extracted from the design file to generate the skin 222, which may include only (or substantially only) the boundary conditions for the components and not additional information that is not associated with the antenna check (or other aspects of the run-set). In this manner, a lighter weight file is processed via the evaluator 206 to generate the analysis 208 in less time, thereby enabling a more iterative process for redesign in the event errors are discovered.

Figure 3A:
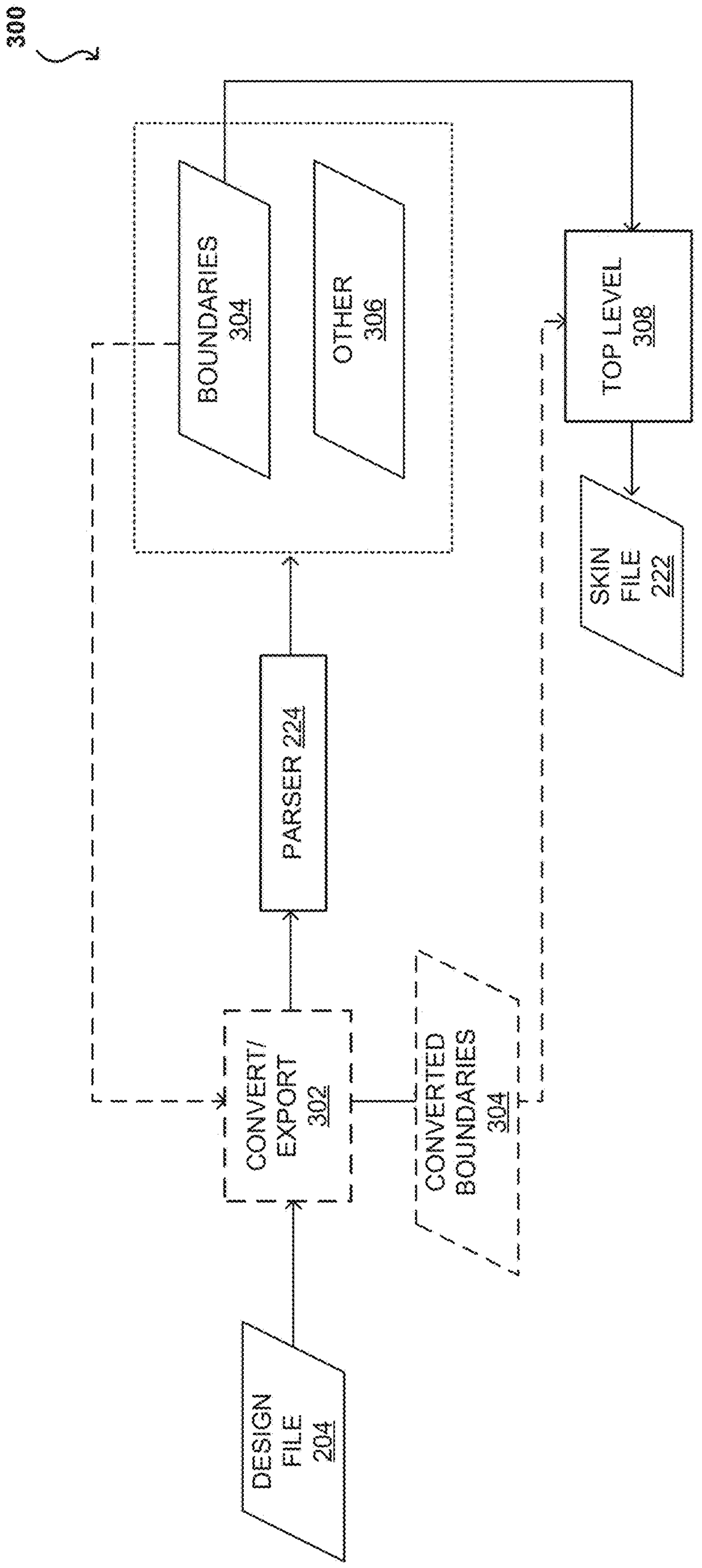
FIG. 3A illustrates an example environment for converting a design file into a skin file in accordance with various embodiments.

FIG. 3A illustrates an environment 300 for identifying and extracting boundary conditions from a full design file. In at least one embodiment, the design file 204 may be an OASIS file, which as noted herein, is a multi-layer format that may be sent to the foundry for production. However, it should be noted that various other embodiments may enable evaluation and parsing of the design file 204 in other formats, such as DEF. In this manner, a producer may not be tied to a particular proprietary place and route program because the DEF file provides a logical and physical representation of the topography of the IC and can be converted for use with a variety of different place and route programs.

In this example, the design file 204 may be associated with a singular component. However, in other embodiments, the design file 204 may be for an entire IC and individual components within the IC may be evaluated using systems and methods of the present disclosure. An optional converter/exporter 302 may be used to convert or otherwise modify the design file 204. For example, an OASIS file may be exported from a place and route program as a DEF file. In other example, a DEF file may be converted into an OASIS file for use with a place and route program. As noted herein, different conversions and/or exportations may be based, at least in part, on particular software programs used in the design progress, and therefore, specific file formats and the like are provided by way of non-limiting example only. In at least one embodiment, conversion of one or more files may not be used because systems and methods may be executed against a variety of different file types. For example, connection information within a DEF file may be provided in terms of different material and layer connections between components, and as a result, may be easier to faster to evaluate than an OASIS file, as an example. Additionally, a full IC may be represented as a DEF file. However, connection information may also be obtained from an OASIS file or other top level file. Accordingly, conversion and/or exportation of files may be used based on particular software systems incorporated into the design of the IC.

The design file 204 (and/or the converted or exported design file) may be evaluated by the parser 224 in order to identify one or more boundary conditions that are associated with connections between components. As described herein, both the OASIS and DEF files may provide logical representations of the IC with clear indicators associated with connections between components. For example, the files may be scanned or otherwise evaluated and one or more tags or indicators within the files may be associated with boundaries. These particular locations, including their positions on the components, the level of the design, the type of connection, and/or the like, may be extracted from the design file 204 to generate a boundary file 304, which may be an intermediate version of the skin file 222 and/or be used to generate the skin file 222. Generation of the boundary file 304 may include parsing or otherwise evaluating different portions of the design file 204 for information indicative of a boundary condition. For example, as noted, DEF files include a well defined structure of cells, sub-cells within blocks, wires, etc. As a result, identification of connections at different instances and their associated netNames may include specific pins where connections are formed. This information may then be maintained while other information is reduced or otherwise not carried forward into the boundary file. With other file formats, like OASIS, a defined connectivity may be determined between different polygons and components (e.g., identifying how a particular element at a certain layer connects to another element at another layer). This identified connection may then be maintained within the boundary file 304.

In at least one embodiment, each individual component may have its own skin file, which as noted herein, may also be referred to as a reduced design file. The reduced design file may correspond to a database of information for the component that includes less information than the original design file because certain sub-components may be removed if they are not associated with boundary conditions. As a result, the design file 204 may be broken into or otherwise segmented into the boundary file 304 (e.g., an individual reduced design file, a full reduced design file) and one or more other files 306. In other words, if the entire design file 204 (either for an individual component of the IC or the IC as a whole) is thought of as being represented by Z, the output from the parser 224 will identify and break the design file into the boundary file 304 (X) and the one or more other files 306 (Y), such that Z=X+Y. Further processing may then only be performed on X representative of the boundary conditions that are most likely to potentially create antennas during manufacturing.

In at least one embodiment, additional conversion and/or exportation may be used on the boundary file 304. For example, if an initial DEF file was parsed, it may be desirable to convert the boundary file 304 back to an OASIS file. Similarly, if an initial OASIS file were parsed, it may be desirable to convert the boundary file 304 to a DEF file. In this manner, either format may be used, thereby reducing reliance on particular software programs and enabling free use of a variety of different applications.

The boundary file 304 (either converted or not) may then be provided to a top level integrator 308 that may merge one or more individual boundary file 304 into a common top level file. In other words, the top level integrator 308 may combine and aggregate each component in a hierarchical fashion to generate the skin file 222 for use with the evaluator 206 for processing against the run-set 202. For example, a boundary file 304 may be created for various components forming the IC, and those individual boundary files 304 may then be merged into a top level file representative of connections within the IC as a whole. Accordingly, the design file 204, which corresponds to either the full IC or a component of the IC, may be parsed to identify boundary conditions to generate a smaller, lighter file for evaluation against the run-set. As described herein, the smaller, lighter file may refer to a file that has fewer sub-components. That is, the lighter file may refer to a smartly reduced database. However, in at least one embodiment, the lighter file may also be smaller in terms of memory usage. But, in at least one embodiment, the type of file format may control a file size, in terms of memory usage, while still being lighter weight. For example, a particular file format may occupy more memory, even if there is less data within that file size. Accordingly, smaller, lighter files may refer to files that are one or more of smaller in terms of memory occupation and/or include fewer sub-components. In this manner, the run-set evaluation may be completed faster and with reduced resource use. This quicker evaluation may enable a more iterative design process in the event antenna issues are identified during the evaluation.

Figure 3B:
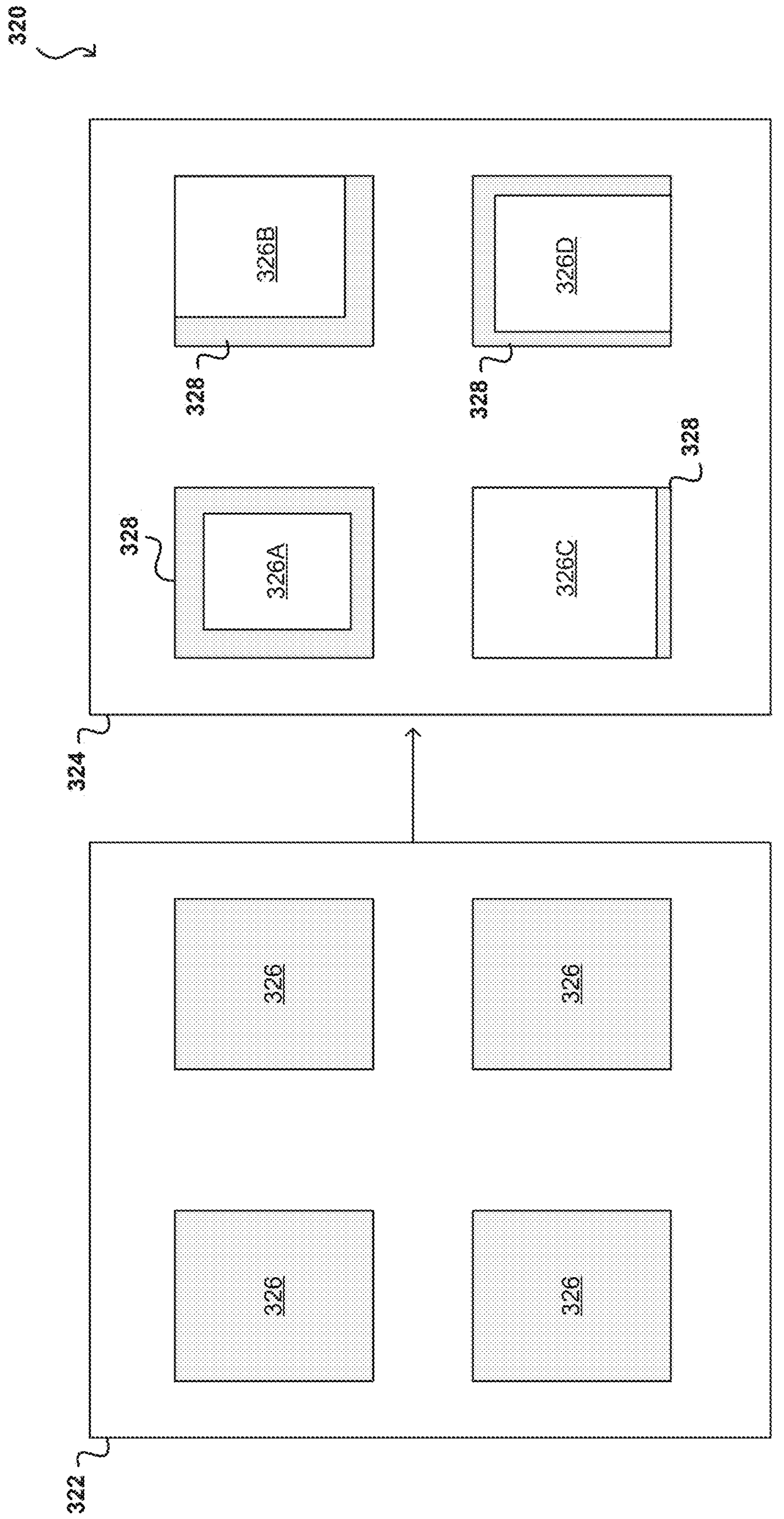
FIG. 3B illustrates a representation of a converted top level design file in accordance with various embodiments.

FIG. 3B is a representation 320 of a conversion between a full top level 322 and a reduced top level 324. In this example, the full top level 322 includes representative child blocks 326 that are shown as being shaded to represent their full configuration and/or build. That is, the child blocks 326 may be provided to the top level integrator to generate the full top level 322 with a full design file for each of the child blocks 326. As a result, the collective design file for the full top level 322 may be large, and also be associated with a database of components, that may take significant time and resource capacity to execute against the run-set. Embodiments of the present disclosure may be used to reduce the size of the child blocks 326, and as a result, reduce the size of the full top level 322 by generating the reduced top level 324.

As shown, the reduced top level 324 includes the child blocks 326 in which information is removed that is not associated with a connection or boundary condition. That is, the child blocks 326 may be parsed using systems and methods described herein to generate the skin files 322 to generate the reduced top level 324. In this example, the child block 326A includes boundaries 328 (shown as shaded portions) along each edge. However, other child blocks 326 may include fewer boundaries 328. For example, the child block 326B only includes boundaries 328 along the left edge and bottom edge. Additionally, the child block 326C only includes the boundary 328 along the bottom edge and the child block 326D includes the boundaries 328 along each of the left, right, and top edges. Accordingly, during evaluation of the reduced top level 324, only the particular boundaries 328 may be evaluated for antenna errors, thereby reducing the amount of data that is processed during the antenna check, which may reduce resource utilization while also reducing a total time to perform the antenna check.

Systems and methods of the present disclosure may be used to reduce run times for antenna reviews, among other IC evaluations, prior to submitting a design to a foundry for manufacturing. One such evaluation includes an antenna review, in which IC designs are evaluated to determine whether one or more manufacturing processes will create a large enough charge that will dissipate and damage other components. Currently, the foundry may provide a run-set that includes a set of rules or parameters that is executed against a design file, which may be a multi-layer format such as OASIS or a physical representation of IC topography, such as DEF. The full design file is provided as an input, usually at or near the end of IC development, and then the result of the evaluation may lead to redesigning or otherwise modifying the IC, which in turn, would cause another evaluation after a new full design file is generated. Systems and methods of the present disclosure address this problem by performing antenna checks at each level by focusing on boundary issues between components. These boundaries are often well defined within the design files and can be identified using one or more software tools, such as a parser that can evaluate either the OASIS or the DEF files.

In at least one embodiment, a software tool may be implemented that receives a logical and/or physical representation of the design (e.g., either an OASIS or DEF file). From there, all cells that directly interface with a component may be selected as those having boundary conditions, while others are removed, thereby generating a file with reduced size and complexity that focuses only on the boundary conditions. In certain embodiments, the newly generated file, which may be referred to as a skin, may be upwards of 90% lighter than the full design file. Each component within an IC may be evaluated to generate a skin to be provided to a top level integrator for generation of a top level using the skins for evaluation against the run-set. This reduced file may then be processed faster than the full design file.

Various embodiments may perform evaluations using DEF files to reduce reliance on particular software packages associated with route and place. For example, because the DEF file is a physical representation of the topography, the information may be parsed to identify the boundary conditions and then may be converted or otherwise changed into an OASIS file, if necessary, for further processing. For example, the OASIS file may be used to generate the top level noted herein. Accordingly, various embodiments may be directed toward removal of non-boundary conditions directly from place and route tools to generate a lighter weight file. Furthermore, systems and methods may also be used to parse an equivalent DEF file, independent of the place and route vendor, in order to identify boundary conditions for one or more components with the IC.

Figure 4A:
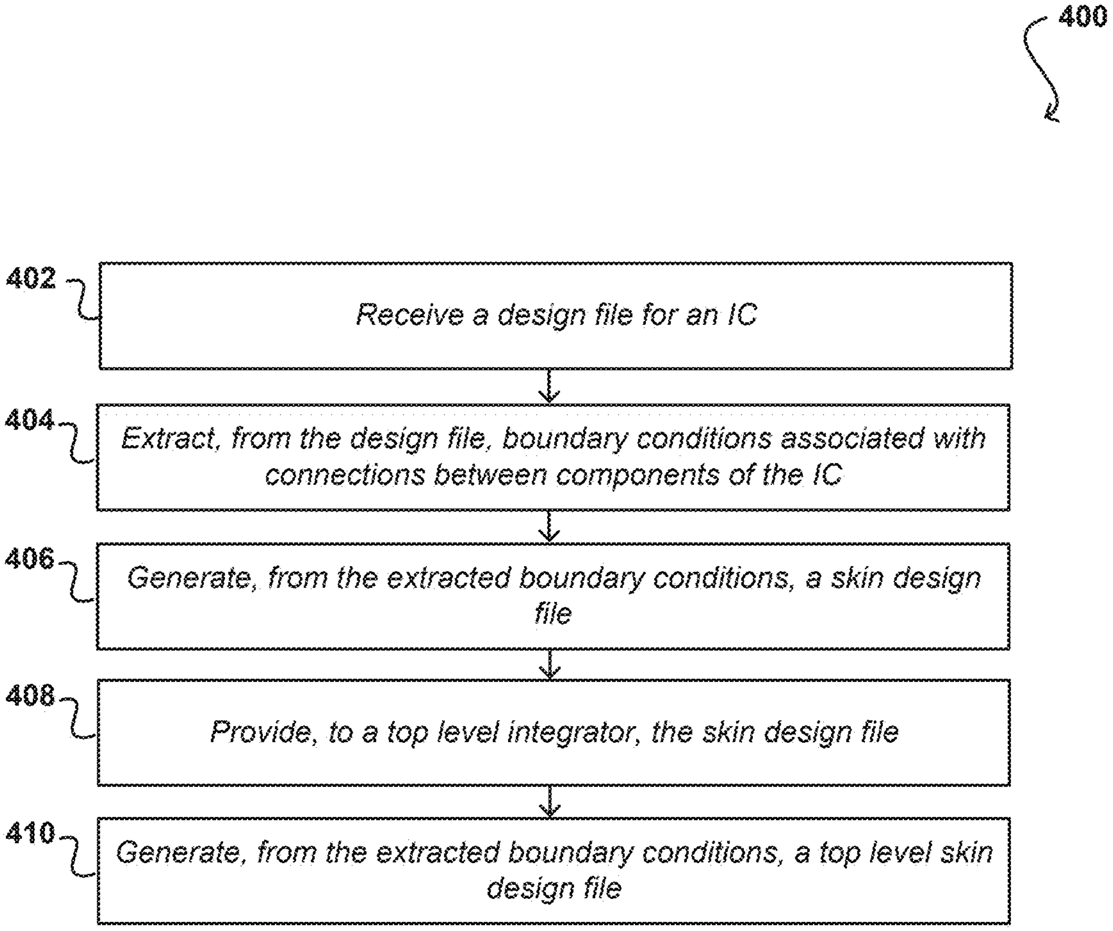
FIG. 4A illustrates an example process for generating a top level skin design file in accordance with various embodiments.

FIG. 4A illustrates an example process 400 for skin generator that can be utilized in accordance with various embodiments. It should be understood for this and other processes discussed herein that there can be additional, alternative, or fewer steps performed in similar or alternative orders, or in parallel, within the scope of the various embodiments unless otherwise stated. Further, while this example is discussed with respect to an IC, it should be understood that aspects of various embodiments can be used with other computing and processing devices as well. In this example, a design file for an IC is received 402. The design file may be a full design file for an entire IC, such as a top level design, or may be a design for an individual component for an IC, among other options. Furthermore, the design file can be in a variety of different data formats, such as OASIS or DEF, among other options.

In at least one embodiment, boundary conditions are extracted from the design file 404. Boundary conditions may be related to areas of connections between different components. The boundary conditions may be evaluated in terms of the hierarchical structure of the design file. The boundary condition may be associated with a particular edge or location of the connection. The extracted boundary conditions may then be used to generate a skin design file 406. In various embodiments, the skin design file is a lighter weight file, which in certain embodiments is up to approximately 90% lighter than the design file, that eliminates various components that are not associated with boundary conditions, thereby providing fewer areas to check during an evaluation process. The skin design file may then be provided to a top level integrator 408 where it can be merged to generate a top level skin design file 410. For example, one or more skin design files may be combined or merged with the top level skin design file, which may include replacing previous full design files. In this manner, a lighter file (e.g., a file that has less data content) may be created that includes sufficient information for evaluation against a run-set, such as during an antenna check.

Figure 4B:
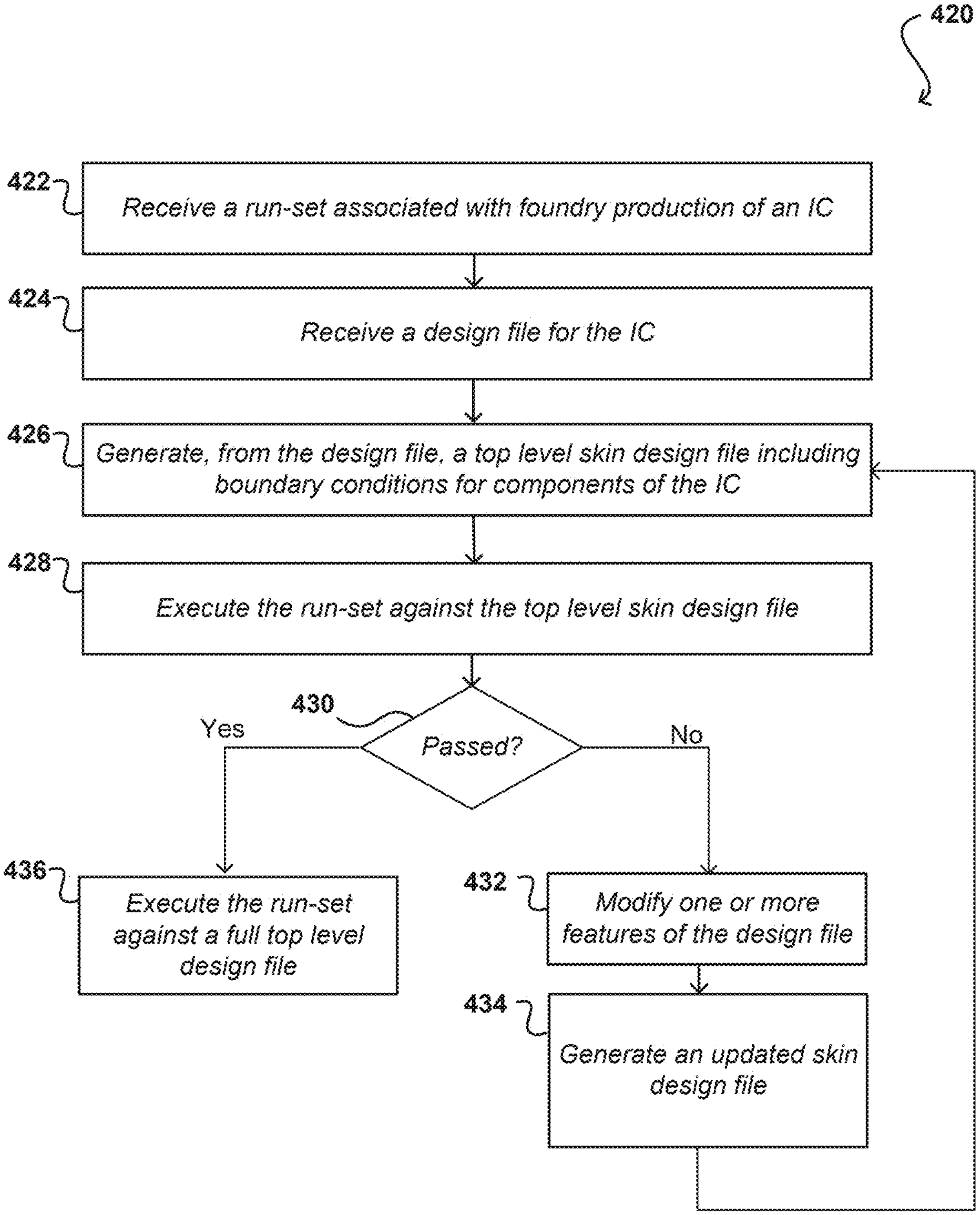
FIG. 4B illustrates an example process for executing a run-set against a top level skin design file in accordance with various embodiments.

FIG. 4B illustrates an example process 420 for executing a run-set against a design file. In this example, a run-set is received from a foundry associated with production of an IC 422. Additionally, this example includes receiving a design file for an IC 424 and generating, from the design file, a top level skin 426. The top level skin may correspond to a lighter weight design file that eliminates various features and maintains boundary conditions between components of the IC. In at least one embodiment, the top level skin may be generated from different skins for a variety of components used to form the IC. The run-set may then be executed against the top level skin design file 428. A determination may be made to determine whether the run-set passed 430. If not, then the design may be modified 432. In various embodiments, modification to the design file may be made to one or more individual component (and/or their respective design files) and then re-merged into the top level, or may be made within the top level itself. In embodiments where the individual design file is modified, an updated skin design file may be generated 434 for further evaluation. For example, the updated skin design file may then be re-merged into the top level skin design file. If the run-set passes, then a full top level design file may be generated, which includes each feature of the individual components, and the run-set may be executed against the full top level design file 436.

Figure 5:
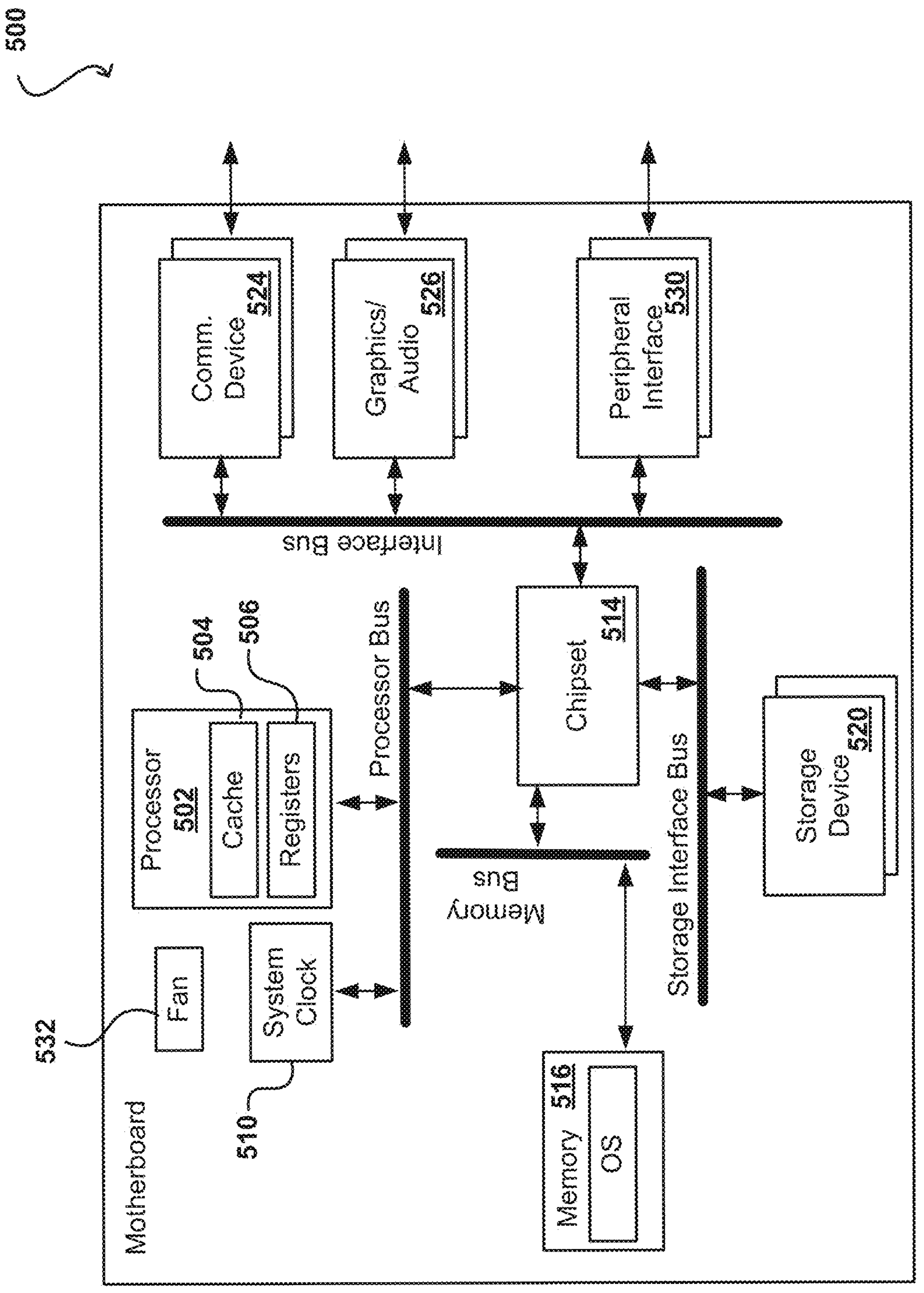
FIG. 5 illustrates components of an example computing device that can be utilized in accordance with various embodiments.

Computing resources, such as servers, that can have software and/or firmware updated in such a matter will generally include at least a set of standard components configured for general purpose operation, although various proprietary components and configurations can be used as well within the scope of the various embodiments. FIG. 5 illustrates components of an example computing device 500 that can be utilized in accordance with various embodiments. As known for computing devices, the computer will have one or more processors 502, such as central processing units (CPUs), graphics processing units (GPUs), and the like, that are electronically and/or communicatively coupled with various components using various buses, traces, and other such mechanisms. A processor 502 can include memory registers 506 and cache memory 504 for holding instructions, data, and the like. In this example, a chipset 514, which can include a northbridge and southbridge in some embodiments, can work with the various system buses to connect the processor 502 to components such as system memory 516, in the form or physical RAM or ROM, which can include the code for the operating system as well as various other instructions and data utilized for operation of the computing device. The computing device can also contain, or communicate with, one or more storage devices 520, such as hard drives, flash drives, optical storage, and the like, for persisting data and instructions similar, or in addition to, those stored in the processor and memory. The processor 502 can also communicate with various other components via the chipset 514 and an interface bus (or graphics bus, etc.), where those components can include communications devices 524 such as cellular modems or network cards, media components 526, such as graphics cards and audio components, and peripheral interfaces 530 for connecting peripheral devices, such as printers, keyboards, and the like. At least one cooling fan 532 or other such temperature regulating or reduction component can also be included as well, which can be driven by the processor or triggered by various other sensors or components on, or remote from, the device. Various other or alternative components and configurations can be utilized as well as known in the art for computing devices.

At least one processor 502 can obtain data from physical memory 516, such as a dynamic random access memory (DRAM) module, via a coherency fabric in some embodiments. It should be understood that various architectures can be utilized for such a computing device, that may include varying selections, numbers, and arguments of buses and bridges within the scope of the various embodiments. The data in memory may be managed and accessed by a memory controller, such as a DDR controller, through the coherency fabric. The data may be temporarily stored in a processor cache 504 in at least some embodiments. The computing device 500 can also support multiple I/O devices using a set of I/O controllers connected via an I/O bus. There may be I/O controllers to support respective types of I/O devices, such as a universal serial bus (USB) device, data storage (e.g., flash or disk storage), a network card, a peripheral component interconnect express (PCIe) card or interface 330, a communication device 524, a graphics or audio card 526, and a direct memory access (DMA) card, among other such options. In some embodiments, components such as the processor, controllers, and caches can be configured on a single card, board, or chip (i.e., a system-on-chip implementation), while in other embodiments at least some of the components may be located in different locations, etc.

An operating system (OS) running on the processor 502 can help to manage the various devices that may be utilized to provide input to be processed. This can include, for example, utilizing relevant device drivers to enable interaction with various I/O devices, where those devices may relate to data storage, device communications, user interfaces, and the like. The various I/O devices will typically connect via various device ports and communicate with the processor and other device components over one or more buses. There can be specific types of buses that provide for communications according to specific protocols, as may include peripheral component interconnect) PCI or small computer system interface (SCSI) communications, among other such options. Communications can occur using registers associated with the respective ports, including registers such as data-in and data-out registers. Communications can also occur using memory-mapped I/O, where a portion of the address space of a processor is mapped to a specific device, and data is written directly to, and from, that portion of the address space.

Such a device may be used, for example, as a server in a server farm or data warehouse. Server computers often have a need to perform tasks outside the environment of the CPU and main memory (i.e., RAM). For example, the server may need to communicate with external entities (e.g., other servers) or process data using an external processor (e.g., a General Purpose Graphical Processing Unit (GPGPU)). In such cases, the CPU may interface with one or more I/O devices. In some cases, these I/O devices may be special-purpose hardware designed to perform a specific role. For example, an Ethernet network interface controller (NIC) may be implemented as an application specific integrated circuit (ASIC) comprising digital logic operable to send and receive packets.

In an illustrative embodiment, a host computing device is associated with various hardware components, software components and respective configurations that facilitate the execution of I/O requests. One such component is an I/O adapter that inputs and/or outputs data along a communication channel. In one aspect, the I/O adapter device can communicate as a standard bridge component for facilitating access between various physical and emulated components and a communication channel. In another aspect, the I/O adapter device can include embedded microprocessors to allow the I/O adapter device to execute computer executable instructions related to the implementation of management functions or the management of one or more such management functions, or to execute other computer executable instructions related to the implementation of the I/O adapter device. In some embodiments, the I/O adapter device may be implemented using multiple discrete hardware elements, such as multiple cards or other devices. A management controller can be configured in such a way to be electrically isolated from any other component in the host device other than the I/O adapter device. In some embodiments, the I/O adapter device is attached externally to the host device. In some embodiments, the I/O adapter device is internally integrated into the host device. Also in communication with the I/O adapter device may be an external communication port component for establishing communication channels between the host device and one or more network-based services or other network-attached or direct-attached computing devices. Illustratively, the external communication port component can correspond to a network switch, sometimes known as a Top of Rack ("TOR") switch. The I/O adapter device can utilize the external communication port component to maintain communication channels between one or more services and the host device, such as health check services, financial services, and the like.

The I/O adapter device can also be in communication with a Basic Input/Output System (BIOS) component. The BIOS component can include non-transitory executable code, often referred to as firmware, which can be executed by one or more processors and used to cause components of the host device to initialize and identify system devices such as the video display card, keyboard and mouse, hard disk drive, optical disc drive and other hardware. The BIOS component can also include or locate boot loader software that will be utilized to boot the host device. For example, in one embodiment, the BIOS component can include executable code that, when executed by a processor, causes the host device to attempt to locate Preboot Execution Environment (PXE) boot software. Additionally, the BIOS component can include or takes the benefit of a hardware latch that is electrically controlled by the I/O adapter device. The hardware latch can restrict access to one or more aspects of the BIOS component, such controlling modifications or configurations of the executable code maintained in the BIOS component. The BIOS component can be connected to (or in communication with) a number of additional computing device resources components, such as processors, memory, and the like. In one embodiment, such computing device resource components may be physical computing device resources in communication with other components via the communication channel. The communication channel can correspond to one or more communication buses, such as a shared bus (e.g., a processor bus, a memory bus), a point-to-point bus such as a PCI or PCI Express bus, etc., in which the components of the bare metal host device communicate. Other types of communication channels, communication media, communication buses or communication protocols (e.g., the Ethernet communication protocol) may also be utilized. Additionally, in other embodiments, one or more of the computing device resource components may be virtualized hardware components emulated by the host device. In such embodiments, the I/O adapter device can implement a management process in which a host device is configured with physical or emulated hardware components based on a variety of criteria. The computing device resource components may be in communication with the I/O adapter device via the communication channel. In addition, a communication channel may connect a PCI Express device to a CPU via a northbridge or host bridge, among other such options.

In communication with the I/O adapter device via the communication channel may be one or more controller components for managing hard drives or other forms of memory. An example of a controller component can be a SATA hard drive controller. Similar to the BIOS component, the controller components can include or take the benefit of a hardware latch that is electrically controlled by the I/O adapter device. The hardware latch can restrict access to one or more aspects of the controller component. Illustratively, the hardware latches may be controlled together or independently. For example, the I/O adapter device may selectively close a hardware latch for one or more components based on a trust level associated with a particular user. In another example, the I/O adapter device may selectively close a hardware latch for one or more components based on a trust level associated with an author or distributor of the executable code to be executed by the I/O adapter device. In a further example, the I/O adapter device may selectively close a hardware latch for one or more components based on a trust level associated with the component itself. The host device can also include additional components that are in communication with one or more of the illustrative components associated with the host device. Such components can include devices, such as one or more controllers in combination with one or more peripheral devices, such as hard disks or other storage devices. Additionally, the additional components of the host device can include another set of peripheral devices, such as Graphics Processing Units ("GPUs"). The peripheral devices and can also be associated with hardware latches for restricting access to one or more aspects of the component. As mentioned above, in one embodiment, the hardware latches may be controlled together or independently.

Figure 6:
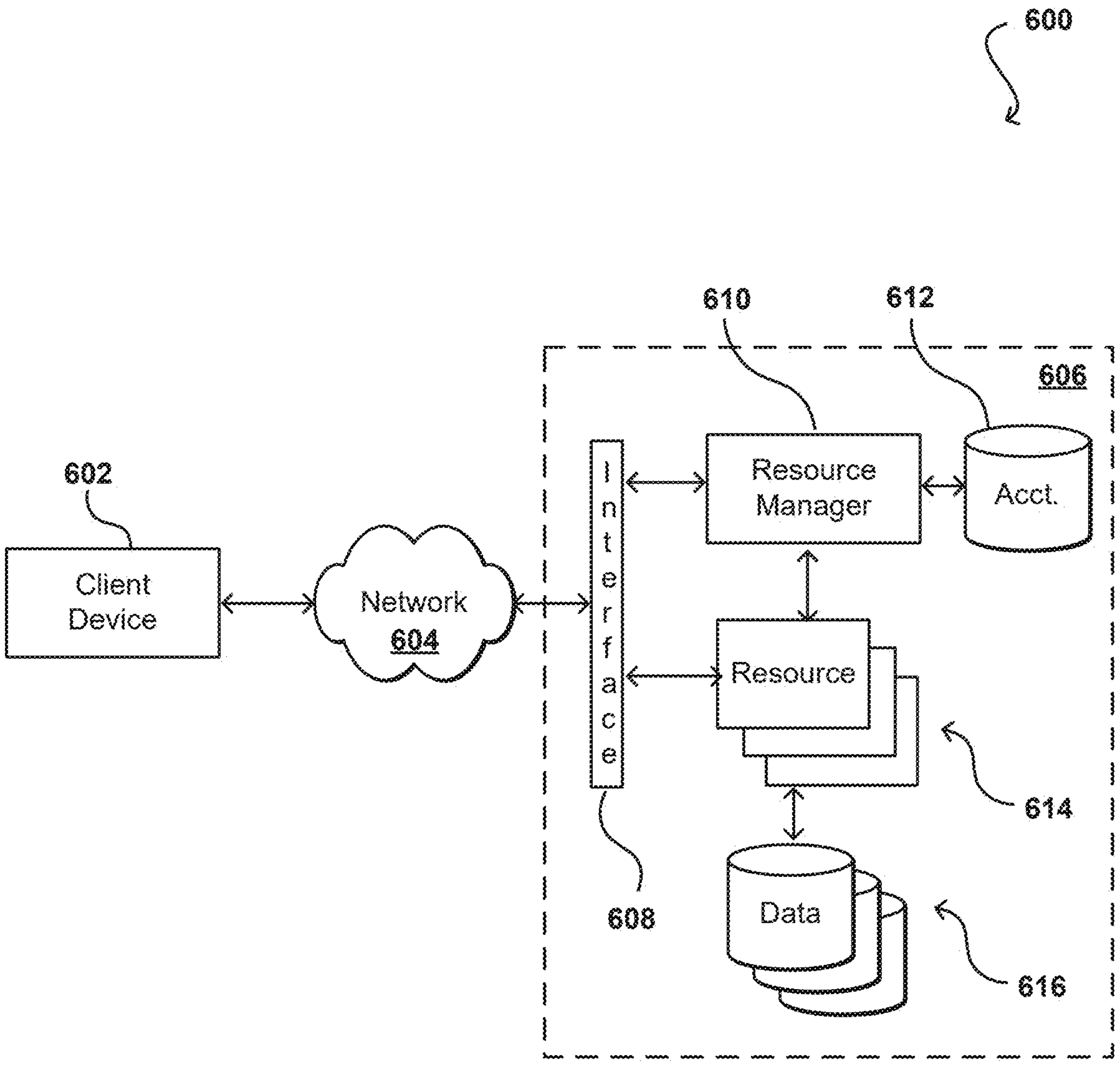
FIG. 6 illustrates components of another example environment in which aspects of various embodiments can be implemented.

As mentioned, such a configuration can be used in some embodiments to provide resource capacity for one or more users or customers as part of a shared resource environment. FIG. 6 illustrates an example of one such environment 600 in which aspects of the various embodiments can be implemented. In this example a user is able to utilize a client device 602 to submit requests across at least one network 604 to a multi-tenant resource provider environment 606. The client device can include any appropriate electronic device operable to send and receive requests, messages, or other such information over an appropriate network and convey information back to a user of the device. Examples of such client devices include personal computers, tablet computers, smart phones, notebook computers, and the like. The at least one network 604 can include any appropriate network, including an intranet, the Internet, a cellular network, a local area network (LAN), or any other such network or combination, and communication over the network can be enabled via wired and/or wireless connections. The resource provider environment 606 can include any appropriate components for receiving requests and returning information or performing actions in response to those requests. As an example, the provider environment might include Web servers and/or application servers for receiving and processing requests, then returning data, Web pages, video, audio, or other such content or information in response to the request.

In various embodiments, the provider environment may include various types of resources that can be utilized by multiple users for a variety of different purposes. As used herein, computing and other electronic resources utilized in a network environment can be referred to as "network resources." These can include, for example, servers, databases, load balancers, routers, and the like, which can perform tasks such as to receive, transmit, and/or process data and/or executable instructions. In at least some embodiments, all or a portion of a given resource or set of resources might be allocated to a particular user or allocated for a particular task, for at least a determined period of time. The sharing of these multi-tenant resources from a provider environment is often referred to as resource sharing, Web services, or "cloud computing," among other such terms and depending upon the specific environment and/or implementation. In this example the provider environment includes a plurality of resources 614 of one or more types. These types can include, for example, application servers operable to process instructions provided by a user or database servers operable to process data stored in one or more data stores 616 in response to a user request. As known for such purposes, the user can also reserve at least a portion of the data storage in a given data store. Methods for enabling a user to reserve various resources and resource instances are well known in the art, such that detailed description of the entire process, and explanation of all possible components, will not be discussed in detail herein.

In at least some embodiments, a user wanting to utilize a portion of the resources 614 can submit a request that is received to an interface layer 608 of the provider environment 606. The interface layer can include application programming interfaces (APIs) or other exposed interfaces enabling a user to submit requests to the provider environment. The interface layer 608 in this example can also include other components as well, such as at least one Web server, routing components, load balancers, and the like.

When a request to provision a resource is received to the interface layer 608, information for the request can be directed to a resource manager 610 or other such system, service, or component configured to manage user accounts and information, resource provisioning and usage, and other such aspects. A resource manager 610 receiving the request can perform tasks such as to authenticate an identity of the user submitting the request, as well as to determine whether that user has an existing account with the resource provider, where the account data may be stored in at least one data store 612 in the provider environment. A user can provide any of various types of credentials in order to authenticate an identity of the user to the provider. These credentials can include, for example, a username and password pair, biometric data, a digital signature, or other such information. The provider can validate this information against information stored for the user. If the user has an account with the appropriate permissions, status, etc., the resource manager can determine whether there are adequate resources available to suit the user's request, and if so can provision the resources or otherwise grant access to the corresponding portion of those resources for use by the user for an amount specified by the request. This amount can include, for example, capacity to process a single request or perform a single task, a specified period of time, or a recurring/renewable period, among other such values. If the user does not have a valid account with the provider, the user account does not enable access to the type of resources specified in the request, or another such reason is preventing the user from obtaining access to such resources, a communication can be sent to the user to enable the user to create or modify an account, or change the resources specified in the request, among other such options.

Once the user is authenticated, the account verified, and the resources allocated, the user can utilize the allocated resource(s) for the specified capacity, amount of data transfer, period of time, or other such value. In at least some embodiments, a user might provide a session token or other such credentials with subsequent requests in order to enable those requests to be processed on that user session. The user can receive a resource identifier, specific address, or other such information that can enable the client device 502 to communicate with an allocated resource without having to communicate with the resource manager 510, at least until such time as a relevant aspect of the user account changes, the user is no longer granted access to the resource, or another such aspect changes.

The resource manager 610 (or another such system or service) in this example can also function as a virtual layer of hardware and software components that handles control functions in addition to management actions, as may include provisioning, scaling, replication, etc. The resource manager can utilize dedicated APIs in the interface layer 608, where each API can be provided to receive requests for at least one specific action to be performed with respect to the data environment, such as to provision, scale, clone, or hibernate an instance. Upon receiving a request to one of the APIs, a Web services portion of the interface layer can parse or otherwise analyze the request to determine the steps or actions needed to act on or process the call. For example, a Web service call might be received that includes a request to create a data repository. An interface layer 608 in at least one embodiment includes a scalable set of user-facing servers that can provide the various APIs and return the appropriate responses based on the API specifications. The interface layer also can include at least one API service layer that in one embodiment consists of stateless, replicated servers which process the externally-facing user APIs. The interface layer can be responsible for Web service front end features such as authenticating users based on credentials, authorizing the user, throttling user requests to the API servers, validating user input, and marshalling or unmarshalling requests and responses. The API layer also can be responsible for reading and writing database configuration data to/from the administration data store, in response to the API calls. In many embodiments, the Web services layer and/or API service layer will be the only externally visible component, or the only component that is visible to, and accessible by, users of the control service. The servers of the Web services layer can be stateless and scaled horizontally as known in the art. API servers, as well as the persistent data store, can be spread across multiple data centers in a region, for example, such that the servers are resilient to single data center failures.

The various embodiments can be further implemented in a wide variety of operating environments, which in some cases can include one or more user computers or computing devices which can be used to operate any of a number of applications. User or client devices can include any of a number of general purpose personal computers, such as desktop or laptop computers running a standard operating system, as well as cellular, wireless and handheld devices running mobile software and capable of supporting a number of networking and messaging protocols. Such a system can also include a number of workstations running any of a variety of commercially-available operating systems and other known applications for purposes such as development and database management. These devices can also include other electronic devices, such as dummy terminals, thin-clients, gaming systems and other devices capable of communicating via a network.

Most embodiments utilize at least one network that would be familiar to those skilled in the art for supporting communications using any of a variety of commercially-available protocols, such as TCP/IP, FTP, UPnP, NFS, and CIFS. The network can be, for example, a local area network, a wide-area network, a virtual private network, the Internet, an intranet, an extranet, a public switched telephone network, an infrared network, a wireless network and any combination thereof.

In embodiments utilizing a Web server, the Web server can run any of a variety of server or mid-tier applications, including HTTP servers, FTP servers, CGI servers, data servers, Java servers and business application servers. The server(s) may also be capable of executing programs or scripts in response requests from user devices, such as by executing one or more Web applications that may be implemented as one or more scripts or programs written in any programming language, such as Java®, C, C# or C++ or any scripting language, such as Perl, Python or TCL, as well as combinations thereof. The server(s) may also include database servers, including without limitation those commercially available from Oracle®, Microsoft®, and IBM® as well as open-source servers such as MySQL, Postgres, SQLite, MongoDB, and any other server capable of storing, retrieving and accessing structured or unstructured data. Database servers may include table-based servers, document-based servers, unstructured servers, relational servers, non-relational servers or combinations of these and/or other database servers.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network (SAN) familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch-sensitive display element or keypad) and at least one output device (e.g., a display device, printer or speaker). Such a system may also include one or more storage devices, such as disk drives, magnetic tape drives, optical storage devices and solid-state storage devices such as random access memory (RAM) or read-only memory (ROM), as well as removable media devices, memory cards, flash cards, etc.

Such devices can also include a computer-readable storage media reader, a communications device (e.g., a modem, a network card (wireless or wired), an infrared communication device) and working memory as described above. The computer-readable storage media reader can be connected with, or configured to receive, a computer-readable storage medium representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs such as a client application or Web browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Storage media and other non-transitory computer readable media for containing code, or portions of code, can include any appropriate media known or used in the art, such as but not limited to volatile and non-volatile, removable and non-removable media implemented in any method or technology for storage of information such as computer readable instructions, data structures, program modules or other data, including RAM, ROM, EEPROM, flash memory or other memory technology, CD-ROM, digital versatile disk (DVD) or other optical storage, magnetic cassettes, magnetic tape, magnetic disk storage or other magnetic storage devices or any other medium which can be used to store the desired information and which can be accessed by a system device. Based on the disclosure and teachings provided herein, a person of ordinary skill in the art will appreciate other ways and/or methods to implement the various embodiments. Additionally, if a particular decision or action is described as being made or performed "based on" a condition or piece of information, this should not be interpreted as that decision or action being made or performed exclusively based on that condition or piece of information, unless explicitly so stated.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A computer-implemented method, comprising:

receiving a design file for a component of an integrated circuit (IC), the design file having a first quantity of data content;

determining, based on one or more indicators associated with the design file, one or more boundary conditions corresponding to connections between the component and one or more additional components of the IC;

extracting, from the design file, the one or more boundary conditions;

generating, using the extracted one or more boundary conditions, a skin design for the component representing the one or more boundary conditions of the component, the skin design having a second file size with less data content than a first file size;

generating, using at least the skin design, a top level skin design; and executing, on the top level skin design, an antenna check.

2. The computer-implemented method of claim 1, further comprising:

receiving a run-set associated with an IC production process.

3. The computer-implemented method of claim 1, wherein the top level skin design includes respective skin designs for the component and the one or more additional components.

4. The computer-implemented method of claim 1, wherein the design file is at least one of an Open Artwork System Interchange Standard file or a Design Exchange Format file.

5. The computer-implemented method of claim 1, further comprising:

converting at least one of the skin design or the design file into a different file format.

6. A computer-implemented method, comprising:

receiving a design file associated with a first integrated circuit (IC) component;

identifying, using one or more indicators of the design file, a boundary condition corresponding to a connection from the first IC component to a second IC component;

extracting the identified boundary condition; and generating a skin design file including the boundary condition combined with at least one additional skin design file.

7. The computer-implemented method of claim 6, further comprising:

providing the skin design file to a top level integrator for inclusion within a top level skin design file.

8. The computer-implemented method of claim 6, wherein the design file is an Open Artwork System Interchange Standard (OASIS) file.

9. The computer-implemented method of claim 8, further comprising:

converting the OASIS file to a Design Exchange Format (DEF) file.

10. The computer-implemented method of claim 9, wherein the converting is performed prior to the identifying.

11. The computer-implemented method of claim 6, wherein the design file is a DEF file, the method further comprising:

converting the DEF file to an OASIS file.

12. The computer-implemented method of claim 6, further comprising:
receiving the skin design file for the first IC component;
receiving a second skin design file for the second IC component; and
merging the skin design file and the second skin design file into a hierarchical top level skin design file.

13. The computer-implemented method of claim 12, further comprising:
performing an antenna check on the top level skin design file.

14. The computer-implemented method of claim 6, wherein the skin design file is a smaller file than the design file.

15. A system, comprising:
at least one processor; and
memory including instructions that, when executed by the at least one processor, cause the at least one processor to:
receive a design file associated with a first integrated circuit (IC) component;
identify, using one or more indicators of the design file, a boundary condition corresponding to a connection from the first IC component to a second IC component;
extract the boundary condition; and
generate a reduced design file including the boundary condition combined with at least one additional reduced design file.

16. The system of claim 15, wherein the design file is an Open Artwork System Interchange Standard (OASIS) file.

17. The system of claim 16, wherein the instructions when executed further cause the at least one processor to:
convert the OASIS file to a Design Exchange Format (DEF) file.

18. The system of claim 17, wherein converting the OASIS file is performed prior to identifying the boundary condition.

19. The system of claim 15, wherein the instructions when executed further cause the at least one processor to:
determine one or more locations on the first component associated with the connection to the second IC component.

20. The system of claim 15, wherein the instructions when executed further cause the at least one processor to:
receive the reduced design file; and
merge the reduced design file into a top level design file, the reduced design file replacing an associated full design file for the first IC component.

* * * * *